United States Patent [19]
De Monaco

[11] Patent Number: 5,512,839
[45] Date of Patent: Apr. 30, 1996

[54] TEST PROBE FOR ELECTRICAL MEASURING INSTRUMENTS, PARTICULARLY FOR VOLTMETERS

[75] Inventor: Edoardo De Monaco, Bäretswil, Switzerland

[73] Assignee: MDM Elektrosystem AG, Wetzikon, Switzerland

[21] Appl. No.: 225,041

[22] Filed: Apr. 7, 1994

[30] Foreign Application Priority Data

May 18, 1993 [CH] Switzerland .......................... 01508/93

[51] Int. Cl.⁶ .................................................. G01R 31/02
[52] U.S. Cl. .......................... 324/754; 324/757; 324/725; 324/508; 439/482
[58] Field of Search .................. 324/66, 754, 508, 324/757, 72.5; 439/169, 173, 482

[56] References Cited

U.S. PATENT DOCUMENTS

| | | | |
|---|---|---|---|
| 2,549,731 | 12/1944 | Wattley | 439/482 |
| 4,263,547 | 4/1981 | Johnson | 324/72.5 |
| 4,721,903 | 1/1988 | Harsch | 324/754 |
| 5,285,163 | 2/1994 | Liotta | 324/508 |

FOREIGN PATENT DOCUMENTS

| | | |
|---|---|---|
| 0337875 | 10/1989 | France . |
| 2441212 | 6/1974 | Germany . |
| 188129 | 5/1937 | Switzerland . |

*Primary Examiner*—Kenneth A. Wieder
*Assistant Examiner*—Kourosh Cyrus Khosravi
*Attorney, Agent, or Firm*—Spencer & Frank

[57] ABSTRACT

The test probe for electrical measuring instruments, particularly for voltmeters, is characterized by an automatic holding device that automatically holds the test probe in a socket-outlet jack of any given design, which device comprises a contact spring at least partially adjacent to a contact pin and bilaterally bulging toward the tip of the contact pin. This results in a universally utilizable test probe that will hold automatically in any jack format of different socket-outlets, shock-hazard protection being ensured at all times.

3 Claims, 1 Drawing Sheet

TEST PROBE FOR ELECTRICAL MEASURING INSTRUMENTS, PARTICULARLY FOR VOLTMETERS

BACKGROUND OF THE INVENTION

The present invention relates to a test probe for electrical measuring instruments, particularly for voltmeters.

It is known that among other things each installed socket-outlet has to be checked in accordance with the NIV specifications, e.g., as to the correct direction of rotation. This calls for simultaneous pick-off of 3 conductors, which, however will require more than one person when conventional test probes are used and for additional handling of the measuring instrument concerned. Moreover, for the large variety of existing socket-outlets having varying jack formats, adapters are indispensable so as to be able to always utilize the same test probes.

SUMMARY OF THE INVENTION

Therefore, it is the object of the present invention to provide a test probe for electrical measuring instruments, particularly for voltmeters, fitting onto a variety of types of jack formats of socket-outlets and permitting handling of several such test probes at the same time and without requiring additional personnel.

According to the invention, this is achieved by automatic holding means automatically holding the test probe in a socket-outlet jack of any given design.

In this connection, the automatic holding means comprise, according to the invention, a contact spring partially adjacent to a contact pin and bilaterally bulging toward the tip of the contact pin, the contact pin and contact spring preferably being formed in a tabular way.

Furthermore, a preferred embodiment provides a shock-hazard protection sleeve axially slidable into the housing of the test probe against the action of a spring and at least partially encompassing the contact spring.

These measures result in a universally utilizable test probe that will hold automatically in any jack format of different socket-outlets, shock-hazard protection being ensured at all times.

BRIEF DESCRIPTION OF THE DRAWING

An exemplary embodiment of the invention will be set forth hereinafter with reference being made to the drawing, wherein.

DETAILED DESCRIPTION OF THE PREFERRED EMBODIMENTS

Figure 1:
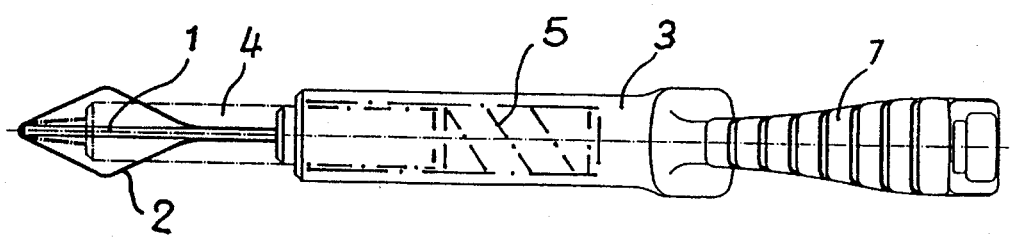
FIG. 1 is a schematic view of a test probe intended for pluggable connection to an appliance cord.
Figure 2:
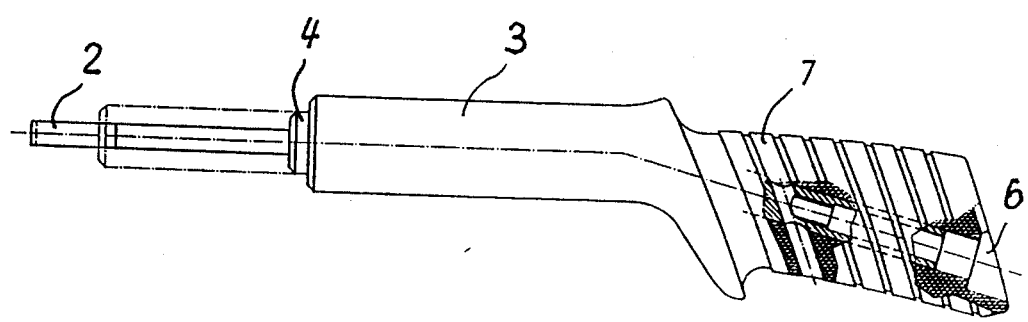
FIG. 2 is a side view of the arrangement of FIG. 1.

The test probe shown, for example for a voltmeter, includes a housing 3 blending into a handle 7. Typically, a contact pin 1 will be electrically connected to a connector sleeve 6 at the free end of the handle 7 for pluggable connection of an electrical measuring instrument cord.

An essential factor of the invention are automatic holding means automatically holding the test probe in a socket-outlet jack of any given design, which means comprise a contact spring 2 partially adjacent to the contact pin 1 and bilaterally bulging toward the tip of the contact pin.

When the contact pin 1 of the test probe is inserted into a live jack, the contact spring 2 is initially compressed by the opening of the jack. After the contact pin 1 is fully inserted, the contact spring 2, likewise in a position within the jack, will exert a spring force against an inner wall of the jack in a clamping manner, causing the probe to be self-holding.

In this context, the contact pin 1 and the contact spring 2 are preferably formed in a tabular way.

Furthermore, according to the invention, shock-hazard protection is of great significance. This is achieved by a shock-hazard protection sleeve 4 axially slidable into the housing 3 of the test probe against the action of the spring 5 and at least partially encompassing the contact spring 2.

This sleeve 4 will slide and retract into the housing 3 against the action of the spring 5 when the test probe is inserted into a socket-outlet jack, the front end of the sleeve 4 coming to rest on the jack's edge where it will additonally stabilize the test probe in an automatically holding manner. This, of course, is due to the additional support provided by sleeve 4, so that the test probe won't, for example, pivot.

While there are shown and described preferred embodiments of the invention, it is to be distinctly understood that the invention is not limited thereto but may be embodied and practised within the scope of the following claims.

ACCORDINGLY;

What I claim is:

1. A test probe for an electrical measuring instrument, comprising:

a housing;

a contact pin having a portion projecting from said housing and forming a probe tip; and automatic holding means for automatically holding the test probe in a variety of different types of socket-outlet jacks, and comprising:

a contact spring partially adjacent to the portion of said contact pin and bilaterally bulging toward the probe tip;

a compression spring located within said housing; and a shock-hazard protection sleeve coaxially slidable along said contact pin and against a force of said compression spring into a first position, and being slidable to at least partially encompass said contact spring in at least a second position.

2. A test probe as defined in claim 1, wherein said shock-hazard protection sleeve is retractable within said housing.

3. A test probe as defined in claim 1, further comprising a connector sleeve electrically connected to said contact pin and being operatively connectable to the electrical measuring instrument.

* * * * *